US008046708B1

(12) United States Patent
Aldrich

(10) Patent No.: US 8,046,708 B1
(45) Date of Patent: Oct. 25, 2011

(54) REVERSED LINKS FROM GRAPHICAL DIAGRAM REPRESENTATION

(75) Inventor: William J. Aldrich, Belmont, MA (US)

(73) Assignee: The MathWorks, Inc., Natick, MA (US)

( * ) Notice: Subject to any disclaimer, the term of this patent is extended or adjusted under 35 U.S.C. 154(b) by 1268 days.

(21) Appl. No.: 10/637,433

(22) Filed: Aug. 7, 2003

(51) Int. Cl.
*G06F 3/048* (2006.01)
(52) U.S. Cl. .............................. 715/771; 714/38; 714/46
(58) Field of Classification Search .................. 715/771, 715/501.1, 711, 782; 703/2; 711/100; 714/38, 714/46–57
See application file for complete search history.

(56) References Cited

U.S. PATENT DOCUMENTS

| | | | | |
|---|---|---|---|---|
| 5,708,825 A * | 1/1998 | Sotomayor | .................... | 715/205 |
| 5,933,841 A * | 8/1999 | Schumacher et al. | ........ | 715/236 |
| 5,963,205 A * | 10/1999 | Sotomayor | .................... | 715/236 |
| 6,055,541 A * | 4/2000 | Solecki et al. | ........................ | 1/1 |
| 6,069,629 A * | 5/2000 | Paterson et al. | ............... | 715/808 |
| 6,078,739 A * | 6/2000 | Paterson et al. | ................... | 703/6 |
| 6,301,579 B1 * | 10/2001 | Becker | .......................... | 707/102 |
| 6,339,838 B1 * | 1/2002 | Weinman, Jr. | ................. | 717/104 |
| 6,442,574 B1 * | 8/2002 | Schumacher et al. | ......... | 715/208 |
| 6,539,347 B1 * | 3/2003 | Paterson et al. | ................... | 703/22 |
| 6,643,634 B2 * | 11/2003 | Koleszar et al. | .................... | 707/1 |
| 6,763,497 B1 * | 7/2004 | Softky | ....................... | 715/501.1 |
| 6,957,191 B1 * | 10/2005 | Belcsak et al. | ................... | 705/38 |
| 6,990,629 B1 * | 1/2006 | Heaney et al. | ................. | 715/200 |
| 7,015,911 B2 * | 3/2006 | Shaughnessy et al. | ........ | 345/440 |
| 7,139,686 B1 * | 11/2006 | Critz et al. | ......................... | 703/2 |
| 7,231,333 B2 * | 6/2007 | Russell et al. | ..................... | 703/6 |
| 7,234,138 B2 * | 6/2007 | Crevatin | ....................... | 717/168 |
| 2003/0071814 A1 * | 4/2003 | Jou et al. | ....................... | 345/440 |
| 2004/0114258 A1 * | 6/2004 | Harris et al. | ................... | 359/841 |

OTHER PUBLICATIONS

Mathworks Inc. et al. "Matlab Report Generator and Simulink Report Generator", 2001. Retrieved from web archive.org http://web.archive.org/web/20010630075329/www.mathworks.com/access/helpdesk/help/toolbox/rptgen/rptgen.shtml.*

* cited by examiner

*Primary Examiner* — Ba Huynh

(74) *Attorney, Agent, or Firm* — Nelson Mullins Riley & Scarborough LLP

(57) ABSTRACT

A method includes performing an analysis or synthesis operation on a graphical model representation, producing a report from the analysis or synthesis operation and generating associations representing elements of the graphical model representation with corresponding elements in the report and using these associations as a way to reposition viewer based on actions to the graphical model representation.

22 Claims, 4 Drawing Sheets

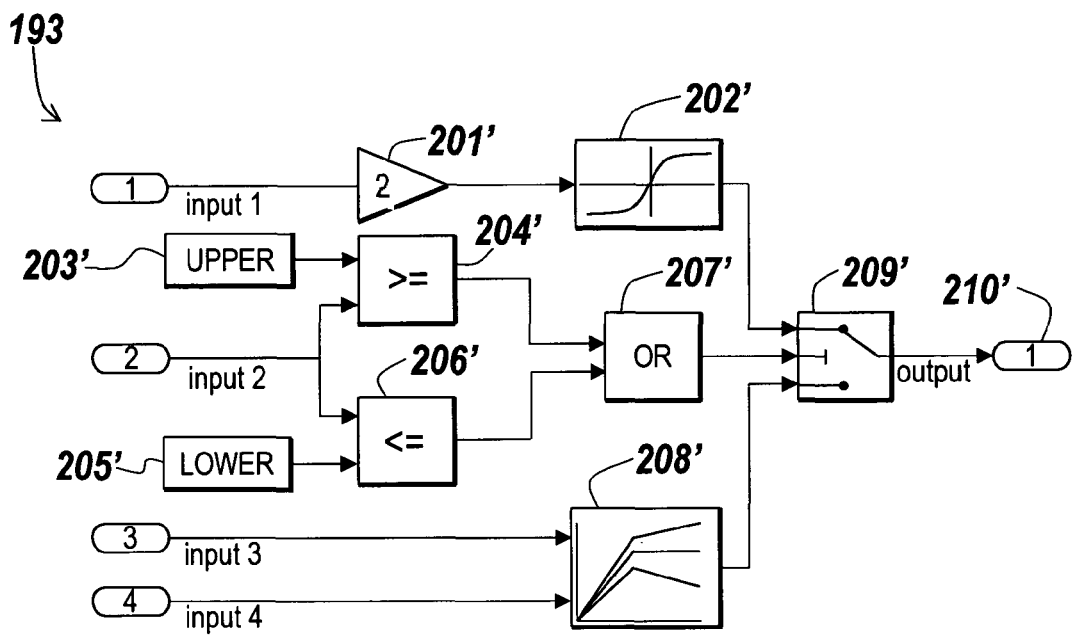

```
192
Block:
  209    /* Switch: '<Root>/Switch' incorporates:
  207     *   Logic: '<Root>/Logical Operator'
  204     *   RelationalOperator: '<Root>/Relational Operator1'
  203     *   Constant: '<Root>/Constant1'
input2    *   Inport: '<Root>/In2'
  206     *   RelationalOperator: '<Root>/Relational Operator'
  205     *   Constant: '<Root>/Constant1'
  202     *   Lookup: '<Root>/Look-Up Table'
  201     *   Gain: '<Root>/Gain'
input1    *   Inport: '<Root>/In1'
  208     *   Lookup2D: '<S1>/Look-Up Table (2-D)'
input3    *   Inport: '<Root>/In3'
input4    *   Inport: '<Root>/In4'
          *
          *  Regarding '<Root>/Gain':
  201     *   Gain value: 2.0
          */
```

*Fig. 4*

REVERSED LINKS FROM GRAPHICAL DIAGRAM REPRESENTATION

TECHNICAL FIELD

This invention relates to reverse links from graphical diagram representation.

BACKGROUND

Data representation and modeling are an integral part of working with dynamic real-world systems such as electrical circuits, shock absorbers, braking systems, and many other electrical, mechanical and thermodynamic systems. These systems can be modeled, simulated, analyzed and synthesized on a computer system using graphical environments such as graphical model representations, state diagrams, truth tables and unified modeling language (UML) diagrams. For example, a graphical model representation visually depicts mathematical relationships among a system's inputs, states, parameters, and outputs, typically through the use of a graphical user interface (GUI). Graphical model representation also visually depicts time-dependent mathematical relationships among a system's inputs, states, and outputs, typically for display on the GUI.

Graphical model representation can involve automatic code generation, a process whereby software source code and/or hardware design language (HDL) source code is automatically produced from a graphical model representation of a dynamic system. For example, the software source code produced by the automatic code generation process can be compiled and executed on a target processor, implementing the functionality specified by the graphical model representation. A code generation report can also be produced. A code generation report is a mark up language document that contains information of the source graphical model representation, settings of the code generator and the generated software (code) in syntax highlighted form. Each part of the generated software is translated by a compiler and saved into its own mark up language file. These markup language reports can be extremely long, complex and detailed.

SUMMARY

According to one aspect of the invention, a method includes performing an analysis or synthesis operation on a graphical model representation, producing a report from the analysis or synthesis operation, and generating associations representing elements of the graphical model representation with corresponding elements in the report.

One or more of the following features can also be included. The report can be a document structured with portions corresponding to different elements of the graphical model representation. The document can be a structural coverage report. The document can be a code generation report incorporating syntax highlighted code. The document can be a profiling report that documents relative execution times of each of the elements.

In embodiments, the method can include loading an element in the report in response to activating a graphical object on the graphical model representation. Activating can be a computer mouse action. The associations are markup language tags. The markup language tags are hypertext markup language (HTML) tags. The report can be a model coverage report. The report can be a generated code report.

According to another aspect of the invention, a system includes a means for performing an analysis or synthesis operation on a graphical model representation, a means for producing a report from the analysis or synthesis operation, and a means for generating associations representing elements of the graphical model representation with corresponding elements in the report.

One or more of the following features can also be included. The system can include a means for loading an element in the report in response to activating one of the graphical model elements. The report can be a document structured with portions corresponding to different elements of the graphical model representation. The document can be a structural coverage report. The document can be a code generation report incorporating syntax highlighted code. The document can be a profiling report that documents relative execution times of each of the elements. The associations can be markup language tags. The markup language tags can be hypertext markup language (HTML) tags. The markup language tags can be portable document format (PDF) embedded links. The report can be a model coverage report. The report can be a generated code report.

Other features, objects, and advantages of the invention will be apparent from the description and drawings, and from the claims.

DESCRIPTION OF DRAWINGS

FIG. 4 is an exemplary graphical model representation of a dynamic system.

DETAILED DESCRIPTION

Figure 1:
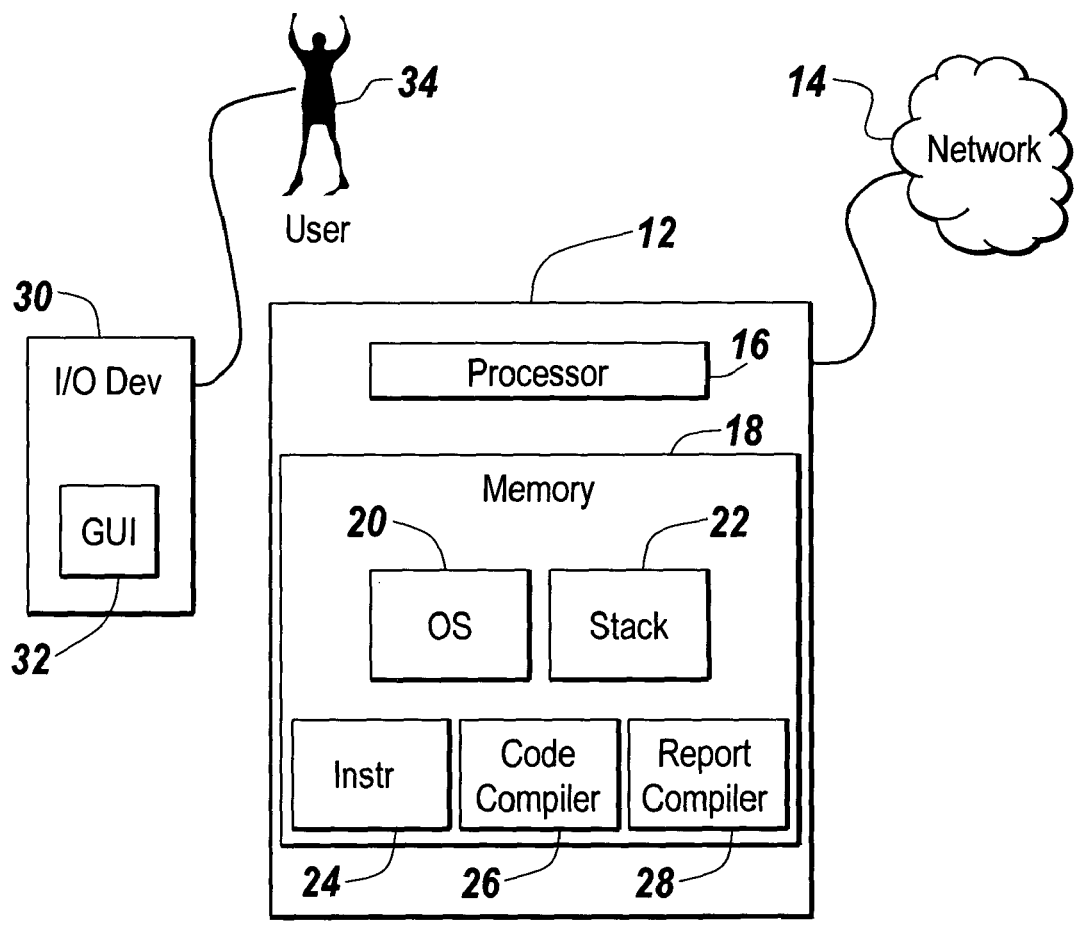
FIG. 1 is a graphical model representation of a code generation report generating system.

In FIG. 1, an exemplary code generation report generating system 10 includes a computer 12, such as a personal computer (PC). Computer 12 is connected to a network 14, such as the Internet, that runs TCP/IP (Transmission Control Protocol/Internet Protocol) or other suitable protocol. Connections can be via Internet, wireless link, telephone line, and the like.

Computer 12 includes a processor 16 and memory 18. Memory 18 stores an operating system (OS) 20 such as Windows XP or Linux, a TCP/IP protocol stack 22 for communicating over network 14, machine executable instructions 24 executed by processor 16 to perform a reverse link graphical diagram representation process 100, and a report compiler 28. Computer 12 includes an input/output (I/O) device 30 for display of a graphical user interface (GUI) 32 to a user 34. A graphical model representation can be displayed on the GUI 32 using, for example, a model editor (not shown). The GUI 32 is also used as a document viewer, which displays textual content, e.g., a report.

Figure 2:
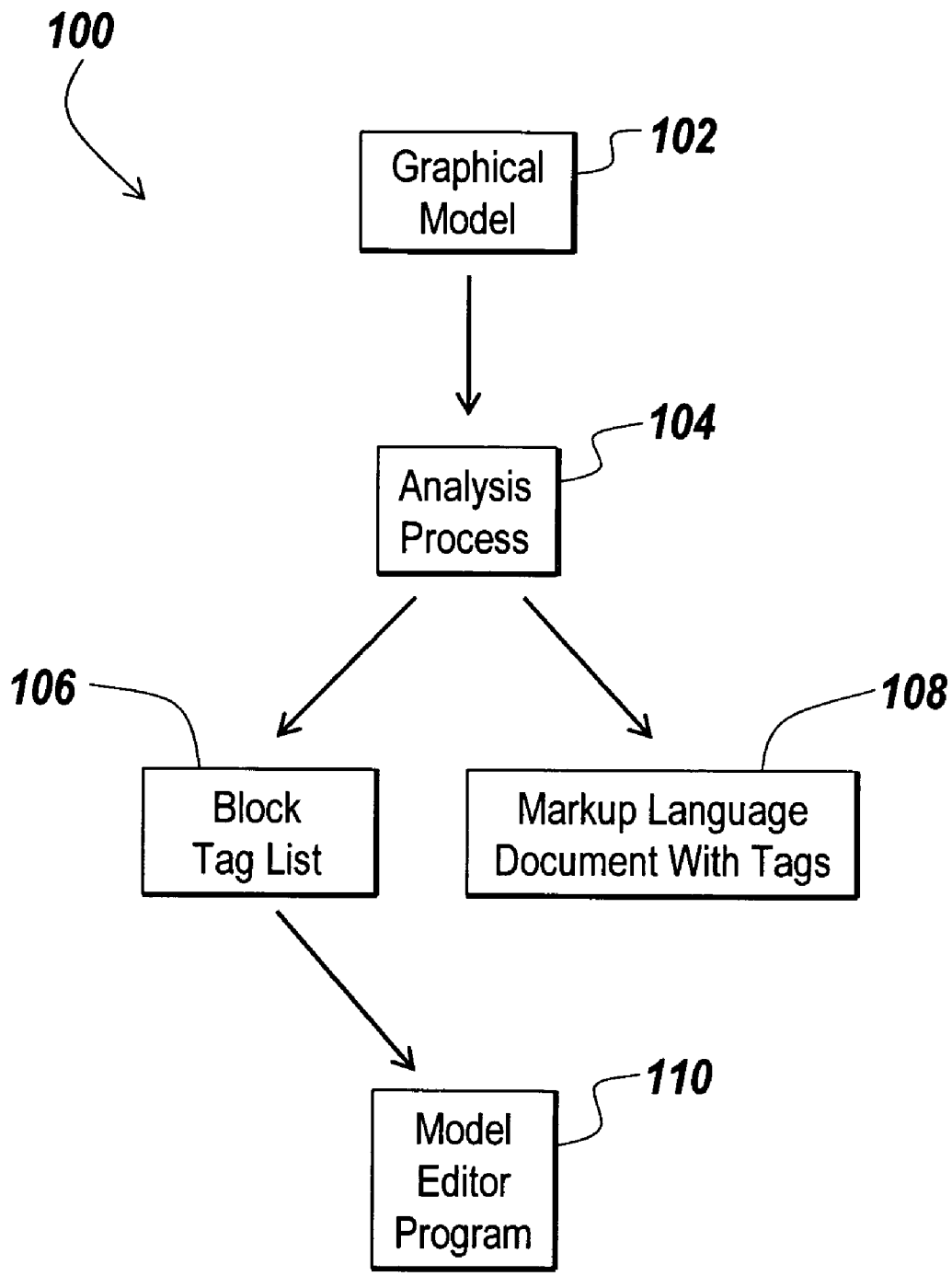
FIG. 2 is a flow diagram of the reverse linked code from graphical diagram representation process of FIG. 1.

In FIG. 2 the reverse link graphical diagram representation process 100 includes generating (102) a graphical model representation. The graphical model representation represents a dynamic system to be simulated and is displayed to the user 34 on the GUI 32 (e.g., through model editor) of the input/output device 30.

The graphical model representation is specified by the user 34 and represented by a model diagram source model language such as, for example, Simulink® from The Mathworks, Inc. of Natick, Mass. The graphical model is subject to an analysis process 104. The analysis process 104 generates (104) a report from the graphical model representation. The report may take the form of a mark-up language document (such as HTML document) that includes tags. The analysis process generates a block tag list (106) that contains tags for the blocks in the graphical model. The block tag 106 list associates blocks with tags. The block tag list 106 is sent to a model editor program 110, which is responsible for displaying the graphical model 102.

Each graphical object in the graphical model representation that is translated into code is referenced within the code with a tag and the same tag associated with a section of the report. Thus, the user 34 can select a graphical object on the graphical model representation and immediately the viewer displays a location in the report corresponding to that graphical object on the graphical model representation. The graphical model representation contains links or tags to the report that allow the user 34 to navigate from the graphical model representation to the report.

The same tags that are embedded in the report are stored as part of the data structures represented by the graphical objects in the graphical model representation. A tag or association, which can be a hyperlink, is a selectable connection from one word, picture, or information object to another in a multimedia environment such as the World Wide Web, and such objects can include sound and motion video sequences. The most common form of link is a highlighted word or picture that can be selected by the user (with a mouse or in some other fashion), resulting in the immediate delivery and view of another file. The highlighted object is referred to as an anchor. The anchor reference and the object referred to constitute a hyperlink.

Using the graphical model representation as a navigation aid to a report is an elegant way to index into a long and complex report. The report can be any form of document that is structured with portions corresponding to different graphical objects. Examples of reports include: structural coverage reports, code generation reports that incorporate syntax highlighted code, and profiling reports that document the relevant execution times of each model element. The graphical representation can be any hierarchical or non-hierarchical combination of graphical model representations, control flow diagrams, state diagrams and/or data flow diagrams provided within an editor or a viewer that is capable of responding to mouse actions.

A mouse action can be either the result of a movement of a graphical object, a mouse click on top of a graphical object, or the selection of a menu item from a pop-up menu for a graphical object. The result of the mouse action is that a document tag is retrieved from the editor and is passed to the document viewer causing the visible portion of the document to be adjusted to a specified point.

Using a graphical model representation as a navigation tool for a report is an alternative to browsing a structural index of the report or performing some type of text search on the report itself. Both of these techniques are tedious by comparison, thus process 100 allows the user 34 to scan through a familiar graphical representation of a design, i.e., the graphical model representation, and quickly access desired information.

Figure 3:
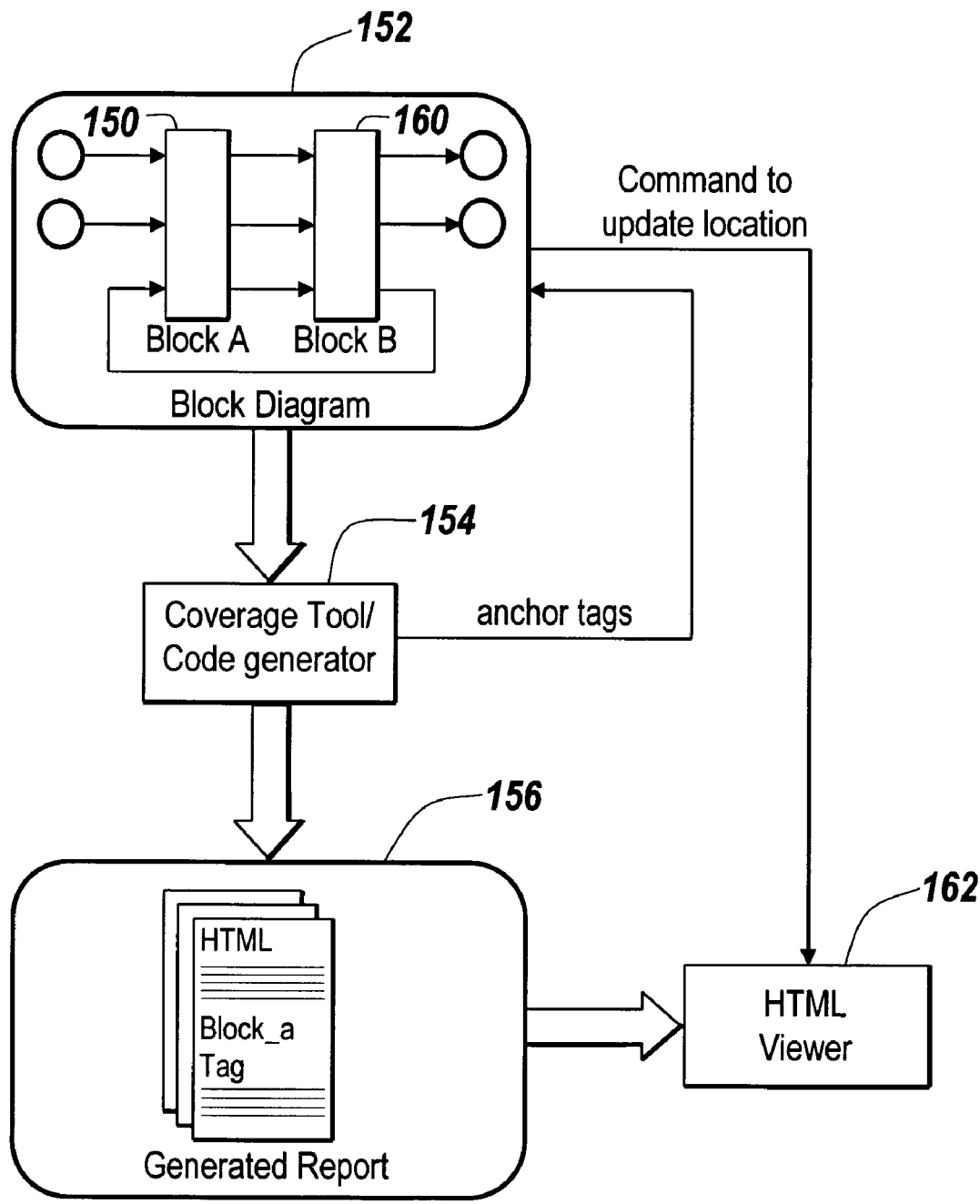
FIG. 3 is a block diagram showing an interaction of a report generator, graphical modeling tool and viewer.

In FIG. 3, a relationship diagram 150 includes a graphical model representation 152, an analysis program and report generator 154 and a generated report 156. The graphical model representation 152 includes blocks 158, 160 and is represented by a model language (not shown). During report generation 154 tags are sent to both appropriate sections of the graphical model representation 152 and the report 156. The same tags are stored as part of the graphical model representation language data structures for block 158, 160. An editor 162 can respond to mouse actions on the tags associated with the blocks 158, 160, and serve a command to position the viewer 162 to the corresponding elements in the report 156. The tags provide communication (e.g., mapping) between elements of the graphical model representation 152 and the report 156. An example of logic within the HTML viewer 162 that responds to mouse clicks is:

function on_mouse_click (blockData)
    if not is empty (blockData.html Tag)
    browser.setlocation (blockData.htmlTag)
end In FIG. 4, an exemplary graphical model representation 190 and associated code generation report 192 are shown. The model elements 201' to 210' include tags that point to corresponding lines 201 to 210 in the code generation report 192. For example, a tag located at 201' points to a gain block representation 201 in the code generation report 192.

In other examples, process 100 is used in conjunction with a model coverage report. Model coverage is a measure of how thoroughly a test of a model tests the model. A model coverage tool determines the extent to which a model test exercises simulation control flow paths through a model. The percentage of paths that a test case exercises is called its model coverage.

For Mathworks Stateflow® charts, the model coverage tool records the execution of the chart itself and the execution of its states, transition decisions, and the individual conditions that compose each decision. When simulation is finished, a model coverage report tells the user how thoroughly a model has been tested in terms of how many times each exclusive OR substate has been active and inactive, how many times each transition decision has been evaluated True or False, and how many times each condition (predicate) has been evaluated True or False.

The invention can be implemented in digital electronic circuitry, or in computer hardware, firmware, software, or in combinations of them. The invention can be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The invention has been described in terms of particular embodiments. Other embodiments are within the scope of the following claims.

What is claimed is:

1. A computer-implemented method comprising:
   performing, using the computer, an analysis or synthesis operation on an executable graphical model representation that includes executable graphical objects representing a dynamic system for simulation, where executing the executable graphical objects simulates the dynamic system represented by the executable graphical objects;
   producing, using the computer, a report from the analysis or synthesis operation, while producing the report:
      generating, using the computer, one or more tags for one or more executable graphical objects of the executable graphical model representation provided in an executable graphical model editor program;
      associating, using the computer, the one or more tags with the one or more executable graphical objects of the executable graphical model representation;
      associating, using the computer, the one or more tags associated with one of the executable graphical objects with portions of the produced report corresponding to the one of the executable graphical objects, wherein associating creates a selectable connection from the one of the executable graphical objects provided in the executable graphical model editor program to the portions of the produced report that correspond to the one of the executable graphical objects, the produced report provided in a document viewer as textual content;
   completing, using the computer, production of the report;
   receiving, using the computer, a selection identifying one of the executable graphical objects in the executable graphical model representation upon completing the production of the report; and
   displaying, using the computer, a location in the report corresponding to the selected executable graphical object in response to the selection on a display device.

2. The method of claim 1 in which the report is a document structured with portions corresponding to different elements of the graphical model representation.

3. The method of claim 2 in which the document is a structural coverage report.

4. The method of claim 2 in which the document is a code generation report incorporating syntax highlighted code.

5. The method of claim 2 in which the document is a profiling report that documents relative execution times of each of the elements.

6. The method of claim 1 in which the selection is made by a computer mouse action.

7. The method of claim 1 in which the one or more tags are markup language tags.

8. The method of claim 7 in which the markup language tags are hypertext markup language (HTML) tags.

9. The method of claim 1 in which the report is a model coverage report.

10. The method of claim 1 in which the report is a generated code report.

11. A system comprising:
    means for generating code for a simulatable graphical model representation including simulatable graphical objects representing a dynamic system for simulation, where simulating the simulatable graphical objects simulates the dynamic system represented by the simulatable graphical objects;
    means for performing an analysis or synthesis operation on the simulatable graphical model representation;
    means for producing a report from the analysis or synthesis operation, the report being distinct from the generated code;
    means for generating one or more tags for one or more simulatable graphical objects of the simulatable graphical model representation provided in a simulatable graphical model editor program while producing the report;
    means for associating the one or more tags with the one or more simulatable graphical objects of the simulatable graphical model representation;
    means for associating the one or more tags associated with one of the simulatable graphical objects with portions of the produced report corresponding to the one of the simulatable graphical objects, wherein associating creates a selectable connection from the one of the simulatable graphical objects provided in the simulatable graphical model editor program to the portions of the produced report that correspond to the one of the simulatable graphical objects, the produced report provided in a document viewer as textual content;
    means for completing production of the report;
    means for referencing the one or more simulatable graphical objects of the simulatable graphical model representation with the one or more associated tags in the generated code;
    means for receiving a selection identifying one of the simulatable graphical objects in the simulatable graphical model representation upon completing the production of the report; and
    means for displaying a location in the report corresponding to the selected simulatable graphical object in response to the selection.

12. The system of claim 11 further comprising means for loading an element in the report in response to activating one of the graphical model elements.

13. The system of claim 11 in which the report is a document structured with portions corresponding to different elements of the graphical model representation.

14. The system of claim 13 in which the document is a structural coverage report.

15. The system of claim 13 in which the document is a code generation report incorporating syntax highlighted code.

16. The system of claim 13 in which the document is a profiling report that documents relative execution times of each of the elements.

17. The system of claim 11 in which the one or more tags are markup language tags.

18. The system of claim 17 in which the markup language tags are hypertext markup language (HTML) tags.

19. The system of claim 17 in which the markup language tags are portable document format (PDF) embedded links.

20. The system of claim 11 in which the report is a model coverage report.

21. The system of claim 11 in which the report is a generated code report.

22. A computer program product residing on a computer readable medium having instructions stored thereon which, when executed a processor, cause the processor to:
- provide a simulatable graphical model including simulatable graphical objects representing a dynamic system for simulation where simulating the simulatable graphical objects simulates the dynamic system represented by the simulatable graphical objects;
- generate code for the simulatable graphical model during a simulation of the simulatable graphical model;
- perform an analysis or synthesis operation on the simulatable graphical model representation;
- produce a report from the analysis or synthesis operation, the report being distinct from the generated code and the report comprising information about the code generated during the simulation of the simulatable graphical model, while producing the report, the instructions cause the processor to:
  - generate one or more tags for one or more simulatable graphical objects of the simulatable graphical model representation provided in a simulatable graphical model editor program;
  - associate the one or more tags with the one or more simulatable graphical objects of the simulatable graphical model representation;
  - associate the one or more tags associated with one of the simulatable graphical objects with portions of the produced report corresponding to the one of the simulatable graphical objects, wherein associating creates a selectable connection from the one of the simulatable graphical objects provided in the simulatable graphical model editor program to the portions of the produced report that correspond to the one of the simulatable graphical objects, the produced report provided in a document viewer as textual content;
- complete production of the report;
- receive a selection identifying one of the simulatable graphical objects in the simulatable graphical model representation upon completing the production of the report; and
- display a location in the report corresponding to the selected simulatable graphical object in response to the selection.

\* \* \* \* \*